United States Patent
Min et al.

(10) Patent No.: US 9,225,341 B2
(45) Date of Patent: Dec. 29, 2015

(54) AUTOMATIC AMPLITUDE CONTROL CIRCUIT

(71) Applicant: Huawei Technologies Co., Ltd., Shenzhen, Guangdong (CN)

(72) Inventors: Qing Min, Shanghai (CN); Jiale Huang, Shanghai (CN); Nianyong Zhu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/493,554

(22) Filed: Sep. 23, 2014

(65) Prior Publication Data

US 2015/0109064 A1  Apr. 23, 2015

(30) Foreign Application Priority Data

Sep. 24, 2013  (CN) .......................... 2013 1 0438634

(51) Int. Cl.
*H03L 5/00*  (2006.01)
*H03L 7/099*  (2006.01)
*H03B 5/10*  (2006.01)

(52) U.S. Cl.
CPC .. *H03L 5/00* (2013.01); *H03B 5/10* (2013.01); *H03L 7/099* (2013.01)

(58) Field of Classification Search
CPC ............. H03L 5/00; H03L 7/099; H03B 5/10
USPC .................................... 331/74, 175, 183, 185
See application file for complete search history.

(56) References Cited

U.S. PATENT DOCUMENTS

| 4,928,314 | A | 5/1990 | Grandfield et al. |
| 4,968,952 | A | 11/1990 | Kehler, Jr. |
| 6,909,336 | B1 * | 6/2005 | Rajagopalan et al. ........ 331/183 |
| 2011/0057736 | A1 * | 3/2011 | Badillo ........................... 331/57 |

FOREIGN PATENT DOCUMENTS

| CN | 1047773 A | 12/1990 |
| CN | 102522984 A | 6/2012 |

* cited by examiner

*Primary Examiner* — Arnold Kinkead

(57) ABSTRACT

The present invention provides an automatic amplitude control circuit, including an oscillator, a collecting module, a first analog current generating module, a second analog current generating module, and a numerical control current generating module. According to this automatic amplitude control circuit, a low-noise numerical control bias current can be provided for the oscillator.

10 Claims, 1 Drawing Sheet

AUTOMATIC AMPLITUDE CONTROL CIRCUIT

CROSS-REFERENCE TO RELATED APPLICATION

This application claims priority to Chinese Patent Application No. 201310438634.0, filed on Sep. 24, 2013, which is hereby incorporated by reference in its entirety.

TECHNICAL FIELD

The present invention relates to the field of circuit control technologies, and in particular, to an automatic amplitude control circuit.

BACKGROUND

In an application of a wireless communications technology, a stable reference frequency is very important. Generally, a crystal oscillator is used to generate a reference frequency of a reference clock and a phase-locked loop that are in a wireless radio frequency transceiver. In some communications protocols, such as in a GSM protocol, it is stipulated that, a difference between a frequency of a wireless portable device and a frequency of a base station needs to be within 0.1 ppm, which requires automatic frequency control (Automatic Frequency Control, hereinafter, AFC for short) on the crystal oscillator, where a signal for the AFC control is a digital signal. A digitally controlled crystal oscillator (Digitally Controlled Crystal Oscillator, hereinafter, DCXO for short) has the following characteristics: The DCXO is low in cost, and can be directly controlled by an external digital signal; and therefore the DCXO is widely used.

However, an oscillation amplitude value of the DCXO greatly affects performance of the DCXO. If oscillation amplitude is excessively large, the DCXO may stay in an overload state for a long time, causing reduced life time and even damage of the DCXO. If the oscillation amplitude is excessively small, noise performance of the DCXO may be affected. Generally, the oscillation amplitude of the DCXO is proportional to a bias current of the DCXO, and the oscillation amplitude of the DCXO may be controlled by changing the bias current of the DCXO. However, no technical solution for effectively controlling a bias current is provided in the prior art. In addition, for a voltage-controlled oscillator (voltage-controlled oscillator, hereinafter, VCO for short) frequently used in a phase-locked loop, oscillation amplitude of the VCO is also proportional to a bias current of the VCO. However, no technical solution for effectively controlling a bias current is provided in the prior art either.

SUMMARY

The present invention provides an automatic amplitude control circuit, which is used to perform effective control on a bias current of an oscillator.

A first aspect of the present invention provides an automatic amplitude control circuit, including an oscillator, a collecting module, a first analog current generating module, a second analog current generating module, and a numerical control current generating module, where the oscillator is configured to generate an oscillation frequency signal;

the collecting module is configured to generate a voltage difference according to oscillation amplitude of the oscillation frequency signal;

the first analog current generating module is configured to convert the voltage difference into a first bias current and, in first time, provide the first bias current for the oscillator, so as to control the oscillation amplitude of the oscillation frequency signal that is generated by the oscillator;

the second analog current generating module is configured to convert the voltage difference into a second bias current, where the first bias current is equal to the second bias current; and the numerical control current generating module is configured to adjust, in the first time according to the second bias current, a numerical control current output by the numerical control current generating module, to enable the numerical control current to be consistent with the second bias current, and in second time, provide the numerical control current for the oscillator to serve as a bias current, so as to control the oscillation amplitude of the oscillation frequency signal that is generated by the oscillator, where the second time is the next working time after the first time ends.

In a first possible implementation manner, with reference to the foregoing first aspect, the collecting module includes: an amplitude detector, a reference voltage generator, and a first comparator, where the amplitude detector is configured to collect oscillation amplitude of the oscillator to obtain amplitude information, and convert the amplitude information into an oscillation amplitude voltage;

the reference voltage generator is configured to generate a reference voltage; and the first comparator is configured to obtain the voltage difference according to the oscillation amplitude voltage and the reference voltage.

In a second possible implementation manner, with reference to the foregoing first aspect or the first possible implementation manner, the first analog current generating module includes a first current transistor and a first switch, where the first current transistor is configured to convert the voltage difference into the first bias current; and the first switch is configured to be switched on in the first time so as to provide the first bias current for the oscillator, and be switched off in the second time.

In a third possible implementation manner, with reference to the foregoing second possible implementation manner, a gate of the first current transistor is connected to an output end of the collecting module, a source of the first current transistor is connected to a power supply, and a drain of the first current transistor is connected to the first switch.

In a fourth possible implementation manner, with reference to the foregoing first aspect or the first possible implementation manner, the second analog current generating module includes a second current transistor, and the second current transistor is configured to convert the voltage difference into the second bias current and provide the second bias current for the numerical control current generating module.

In a fifth possible implementation manner, with reference to the fourth possible implementation manner, a gate of the second current transistor is connected to an output end of the collecting module, a source of the second current transistor is connected to a power supply, and a drain of the second current transistor is connected to the numerical control current generating module.

In a sixth possible implementation manner, with reference to the fourth possible implementation manner, the numerical control current generating module includes:

a current comparator, a numerical control module, a digital current array, and a first switch group, where the first switch group is configured to input, to the current comparator in the first time, a numerical control current output by the digital current array;

the current comparator is configured to compare magnitude of the second bias current with that of the numerical control current, and then output a comparison result to the numerical control module;

the numerical control module is configured to adjust a control word of the digital current array according to the comparison result, to enable the numerical control current to be consistent with the second bias current; and the first switch group is further configured to provide, in the second time, the numerical control current for the oscillator to serve as the bias current, and interrupt input of the numerical control current to the current comparator.

In a seventh possible implementation manner, with reference to the sixth possible implementation manner, the numerical control module is specifically configured to:

increase the numerical control current when the comparison result is that the numerical control current is smaller than the second bias current, to enable the numerical control current to be consistent with the second bias current.

In an eighth possible implementation manner, with reference to the sixth possible implementation manner or the seventh possible implementation manner, the numerical control module is implemented by using a digital circuit or software.

In a ninth possible implementation manner, with reference to the first aspect or the first possible implementation manner, the oscillator is a crystal oscillator or a voltage-controlled oscillator.

In the technical solutions provided in the embodiments of the present invention, oscillation amplitude can be controlled within a required working range by using an analog amplitude control loop at an initial startup stage of an oscillator, which takes full advantages of rapidness and smoothness of an analog amplitude control process. After the oscillation amplitude is stable, a digital amplitude control loop is used to perform oscillation amplitude control, and this digital automatic amplitude control circuit can provide a low-noise numerical control bias current for the oscillator, and can improve a quality factor of the oscillator.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show some embodiments of the present invention, and persons of ordinary skill in the art may still derive other drawings from these accompanying drawings without creative efforts.

DESCRIPTION OF EMBODIMENTS

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are a part rather than all of the embodiments of the present invention. All other embodiments obtained by persons of ordinary skill in the art based on the embodiments of the present invention without creative efforts shall fall within the protection scope of the present invention.

Figure 1:
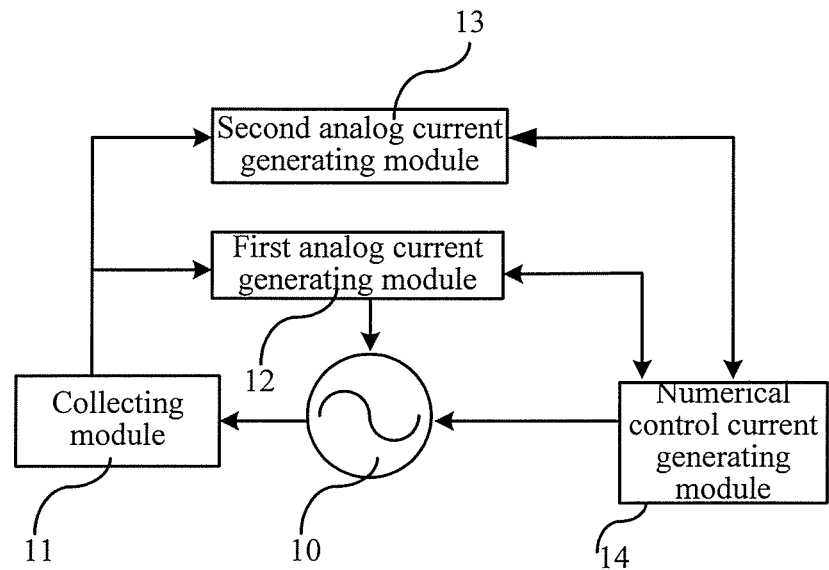
FIG. 1 is a schematic structural diagram of a control circuit according to an embodiment of the present invention.

In view of a defect in the prior art that a bias current of an oscillator cannot be effectively controlled, an embodiment of the present invention provides an automatic amplitude control circuit. FIG. 1 is a schematic structural diagram of an automatic amplitude control circuit according to an embodiment of the present invention. As shown in FIG. 1, the automatic amplitude control circuit includes: an oscillator 10, a collecting module 11, a first analog current generating module 12, a second analog current generating module 13, and a numerical control current generating module 14.

The oscillator 10 is configured to generate an oscillation frequency signal; the collecting module 11 is configured to generate a voltage difference according to oscillation amplitude of the oscillation frequency signal; the first analog current generating module 12 is configured to convert the voltage difference into a first bias current and, in first time, provide the first bias current for the oscillator 10, so as to control oscillation amplitude of the oscillation frequency signal that is generated by the oscillator 10; the second analog current generating module 13 is configured to convert the voltage difference into a second bias current, where the first bias current is equal to the second bias current; the numerical control current generating module 14 is configured to adjust, in the first time according to the second bias current, a numerical control current output by the numerical control current generating module 14, to enable the numerical control current to be consistent with the second bias current, and in second time, provide the numerical control current for the oscillator 10 to serve as a bias current, so as to control the oscillation amplitude of the oscillation frequency signal that is generated by the oscillator 10, where the second time is the next working time after the first time ends.

In the automatic amplitude control circuit provided in the foregoing embodiment of the present invention, the first analog current generating module 12 is set, so that the first analog current generating module 12 generates, according to the oscillation frequency signal, the first bias current that is used to control oscillation amplitude of the oscillator 10; meanwhile, the second analog current generating module 13 with a same current generating capacity is set, so that the second analog current generating module 13 can generate the second bias current according to the foregoing oscillation frequency signal, to serve as an input current of the numerical control current generating module 14. In addition, the numerical control current generating module 14, in the first time, uses the first bias current generated by the first analog current generating module 12 as an input current of the oscillator 10, and the numerical control current generating module 14 performs adjustment on an output numerical control bias current according to the second bias current, to adjust the output numerical control bias current to be consistent in magnitude with the second bias current, and after the first time ends, use the numerical control bias current adjusted and output by the numerical control current generating module 14 as the input current of the oscillator 10. Thereby, in an initial startup stage of the oscillator 10, an analog amplitude control loop is used to control the oscillation amplitude within a required working range, and take full advantages of rapidness and smoothness of an analog amplitude control process. After the oscillation amplitude is stable, a digital amplitude control loop is used to perform oscillation amplitude control, and this digital automatic amplitude control circuit can provide a low-noise numerical control bias current for the oscillator 10, and can improve a quality factor of the oscillator 10.

In the embodiment shown in FIG. 1, the first time therein may be defined as a period from the time when the oscillator 10 is started to the time when the oscillation amplitude is relatively stable and the oscillation amplitude can be controlled within a working range of the oscillator 10, which is specifically related to a property of the oscillator 10 and a quality of an analog amplitude control loop formed by the collecting module 11 and the first analog current generating module 12; and a specific time length of the first time may be obtained by using circuit emulation or a method of an actual test.

Figure 2:
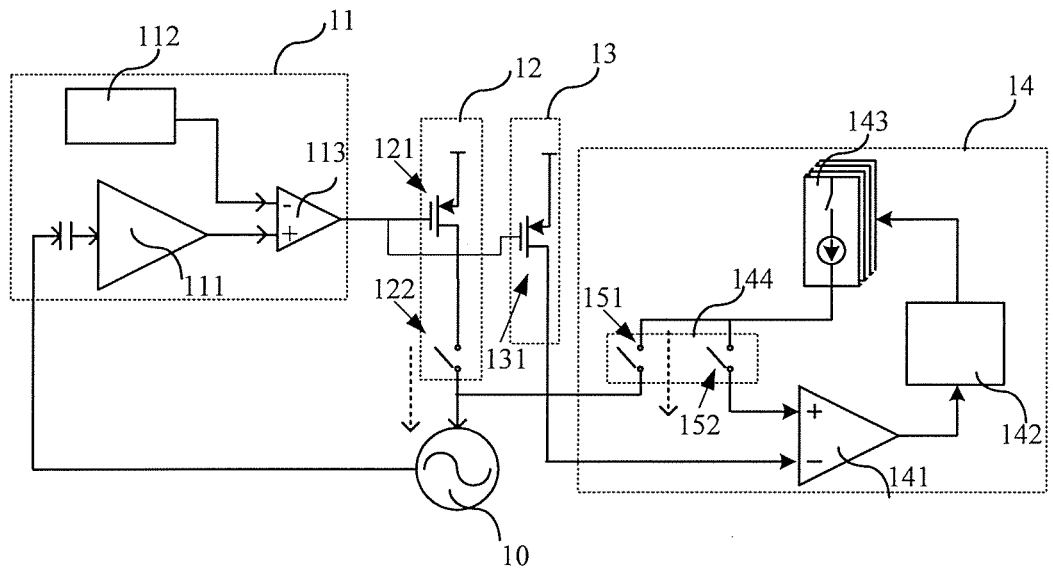
FIG. 2 is a schematic circuit diagram of a control circuit according to another embodiment of the present invention.

FIG. 2 is a schematic circuit diagram of an automatic amplitude control circuit according to an embodiment of the present invention. As shown in FIG. 2, the forgoing collecting module 11 includes an amplitude detector 111, a reference voltage generator 112, and a first comparator 113.

The amplitude detector 111 is configured to collect the oscillation amplitude of the oscillator 10 to obtain amplitude information, and convert the amplitude information into an oscillation amplitude voltage; the reference voltage generator 112 is configured to generate a reference voltage; and the first comparator 113 is configured to obtain the voltage difference according to the oscillation amplitude voltage and the reference voltage.

Specifically, the forgoing oscillation amplitude voltage is used to represent oscillation amplitude magnitude of the oscillator 10, and the first comparator 113 further uses the voltage difference to indicate the oscillation amplitude magnitude. The collecting module in this embodiment is only an example. Other manners may further be used to obtain the voltage difference according to the oscillation amplitude of the oscillator 10, and further generate a bias current according to a bias voltage, so as to control the oscillation amplitude of the oscillator 10 in a negative feedback manner.

In this embodiment, as shown in FIG. 2, the first analog current generating module 12 includes a first current transistor 121 and a first switch 122, where the first current transistor 121 is configured to convert the voltage difference into the first bias current; and the first switch 122 is configured to be switched on in the first time so as to provide the first bias current for the oscillator 10, and be switched off in the second time.

Optionally, the second analog current generating module 13 includes a second current transistor 131, where the second current transistor 131 is configured to convert the voltage difference into the second bias current and provide the second bias current for the numerical control current generating module 14.

The first current transistor 121 and the second current transistor 131 may be implemented by using current transistors of a same specification, which have a same current generating capacity, and can convert an input bias voltage into a bias current of same magnitude.

More specifically, when the oscillator 10 uses an NMOS transistor and the first current transistor 121 is a PMOS transistor, a gate of the first current transistor 121 is connected to an output end of the collecting module 11; more specifically, the gate of the first current transistor 121 is connected to an output end of the first comparator 113 in the collecting module 11, a source of the first current transistor 121 is connected to a power supply, and a drain of the first current transistor 121 is connected to the first switch 122. When the oscillator 10 uses a PMOS transistor, the first current transistor 121 may be an NMOS transistor. At this time, the gate of the first current transistor 121 is connected to the output end of the collecting module 11; more specifically, the gate of the first current transistor 121 is connected to the output end of the first comparator 113 in the collecting module 11, the source of the first current transistor 121 is connected to a power supply, and the drain of the first current transistor 121 is connected to the first switch 122.

In addition, when the oscillator 10 uses an NMOS transistor and the second current transistor 131 is a PMOS transistor, a gate of the second current transistor 131 is connected to the output end of the collecting module 11; more specifically, the gate of the second current transistor 131 is connected to the output end of the first comparator 113 in the collecting module 11, a source of the second current transistor 131 is connected to a power supply, and a drain of the second current transistor 131 is connected to the numerical control current generating module 14. When the oscillator 10 uses a PMOS transistor and the second current transistor 131 is an NMOS transistor, the gate of the second current transistor 131 is connected to the output end of the collecting module 11; more specifically, the gate of the second current transistor 131 is connected to the output end of the first comparator 113 in the collecting module 11, the source of the second current transistor 131 is connected to a power supply (which is not shown in the diagram), and the drain of the second current transistor 131 is connected to the numerical control current generating module 14.

Further, the foregoing numerical control current generating module 14 includes: a current comparator 141, a numerical control module 142, a digital current array 143, and a first switch group 144. The first switch group 144 is configured to input, to the current comparator 141 in the first time, a numerical control current output by the digital current array 143; the current comparator 141 is configured to compare magnitude of the second bias current with that of the numerical control current, and then output a comparison result to the numerical control module 142; the numerical control module 142 is configured to adjust a control word of the digital current array 143 according to the comparison result, to enable the numerical control current to be consistent with the second bias current; and the first switch group 144 is further configured to provide, in the second time, the numerical control current for the oscillator 10 to serve as a bias current, and interrupt input of the numerical control current to the current comparator 141.

Optionally, the numerical control module 142 is specifically configured to increase the numerical control current when the comparison result is that the numerical control current is smaller than the second bias current, to enable the numerical control current to be consistent with the second bias current. The numerical control module 142 may be implemented by using a digital circuit or software.

The first switch group 144 may include a second switch 151 and a third switch 152. A source of the second switch 151 is connected to the digital current array 143, a gate of the second switch 151 is connected to the numerical control module 142, so as to receive a control signal from the numerical control module 142, and a drain of the second switch 151 is connected to the oscillator 10. A source of the third switch 152 is connected to the digital current array 143, a gate of the third switch 152 is connected to the numerical control module 142, so as to receive the control signal from the numerical control module 142, and a drain of the third switch 152 is connected to the current comparator 141.

In addition, a first input end of the current comparator 141 is connected to an output end of the second analog current generating module 13, specifically, is connected to the second current transistor 131 in the second analog current generating module 13; a second input end of the current comparator 141 is connected to an output end of the digital current array 143, and a third switching switch 153 is disposed between the second input end of the current comparator 141 and the output end of the digital current array 143; the third switch 152 is disposed between the output end of the digital current array 143 and an input end of the oscillator 10; an output end of the current comparator 141 is connected to an input end of the numerical control module 142; and an output end of the numerical control module 142 is connected to an input end of the digital current array 143.

In the embodiment shown in FIG. 2, the oscillator 10 therein may be a crystal oscillator or a voltage-controlled oscillator, and a control unit therein may be a timer. A voltage-controlled oscillator is mainly applied to a phase-locked loop for wireless communications, and same as a crystal oscillator, oscillation amplitude magnitude of a voltage-controlled oscillator is proportional to magnitude of a bias current.

Finally, it should be noted that the foregoing embodiments are merely intended for describing the technical solutions of the present invention other than limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. An automatic amplitude control circuit, comprising:
   an oscillator configured to generate an oscillation frequency signal having an oscillation amplitude;
   a collecting module configured to generate a voltage difference between the oscillation amplitude and a reference voltage;
   a first analog current generating module configured to:
      convert the voltage difference into a first bias current, and
      during a first time period, provide the first bias current for the oscillator, so as to control the oscillation amplitude of the oscillation frequency signal that is generated by the oscillator;
   a second analog current generating module configured to convert the voltage difference into a second bias current, wherein the first bias current is equal to the second bias current; and
   a numerical control current generating module configured to:
      adjust, during the first time period and according to the second bias current, a numerical control current output by the numerical control current generating module, to enable the numerical control current to be consistent with the second bias current, and
      during a second time period, provide the numerical control current for the oscillator to serve as a bias current, so as to control the oscillation amplitude of the oscillation frequency signal that is generated by the oscillator, wherein the second time period follows the first time period.

2. The automatic amplitude control circuit according to claim 1, wherein the collecting module comprises:
   an amplitude detector configured to collect the oscillation amplitude of the oscillator to obtain amplitude information, and convert the amplitude information into an oscillation amplitude voltage;
   a reference voltage generator configured to generate the reference voltage; and
   a first comparator is configured to obtain the voltage difference between the oscillation amplitude voltage and the reference voltage.

3. The automatic amplitude control circuit according to claim 1, wherein the first analog current generating module comprises:
   a first current transistor configured to convert the voltage difference into the first bias current; and
   a first switch configured to be switched on during the first time period so as to provide the first bias current for the oscillator, and be switched off during the second time period.

4. The automatic amplitude control circuit according to claim 3, wherein a gate of the first current transistor is connected to an output end of the collecting module, a source of the first current transistor is connected to a power supply, and a drain of the first current transistor is connected to the first switch.

5. The automatic amplitude control circuit according to claim 1, wherein the second analog current generating module comprises:
   a second current transistor configured to convert the voltage difference into the second bias current and provide the second bias current for the numerical control current generating module.

6. The automatic amplitude control circuit according to claim 5, wherein a gate of the second current transistor is connected to an output end of the collecting module, a source of the second current transistor is connected to a power supply, and a drain of the second current transistor is connected to the numerical control current generating module.

7. The automatic amplitude control circuit according to claim 5, wherein the numerical control current generating module comprises:
   a current comparator configured to compare the second bias current with the numerical control current output from a digital current array and output a comparison result to a numerical control module, wherein the numerical control module is configured to adjust a control word of the digital current array according to the comparison result to enable the numerical control current to be consistent with the second bias current; and
   a first switch group configured to:
      during the first time period, input the numerical control current output from the digital current array to the current comparator, and
      during the second time period, input the numerical control current output from the digital current array to the current comparator and provide the numerical control current for the oscillator to serve as the bias current.

8. The automatic amplitude control circuit according to claim 7, wherein the numerical control module is configured to:
   cause an increase in the numerical control current output from the digital current array when the comparison result indicates the numerical control current is smaller than the second bias current, to enable the numerical control current to be consistent with the second bias current.

9. The automatic amplitude control circuit according to claim 7, wherein the numerical control module is implemented by using a digital circuit or software.

10. The automatic amplitude control circuit according to claim 1, wherein the oscillator comprises a crystal oscillator or a voltage-controlled oscillator.

\* \* \* \* \*